(12) United States Patent
Chiran et al.

(10) Patent No.: US 6,599,151 B2
(45) Date of Patent: Jul. 29, 2003

(54) RECEPTACLE TYPE INTERMEDIATE CONNECTOR

(75) Inventors: Kiyohiko Chiran, Takarazuka (JP); Takashi Suyama, Amagasaki (JP); Terumi Nakashima, Takatsuki (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/854,686

(22) Filed: May 15, 2001

(65) Prior Publication Data

US 2001/0046809 A1 Nov. 29, 2001

(30) Foreign Application Priority Data

May 24, 2000 (JP) ........................................ 2000-152571

(51) Int. Cl.[7] ............................................. H01R 13/648
(52) U.S. Cl. ........................ 439/610; 439/607; 439/687
(58) Field of Search ................................. 439/607–610, 439/98, 108, 687

(56) References Cited

U.S. PATENT DOCUMENTS

| | | | | |
|---|---|---|---|---|
| 5,941,733 A | * | 8/1999 | Lai | 439/610 |
| 6,039,606 A | * | 3/2000 | Chiou | 439/607 |
| 6,106,334 A | * | 8/2000 | Kuo | 439/610 |
| 6,162,094 A | * | 12/2000 | Huang | 439/610 |
| 6,165,016 A | * | 12/2000 | Lai | 439/610 |
| 6,231,393 B1 | * | 5/2001 | Lai | 439/610 |
| 6,280,252 B1 | * | 8/2001 | Huang | 439/610 |
| 6,299,486 B1 | * | 10/2001 | Morikawa et al. | 439/610 |

* cited by examiner

*Primary Examiner*—Hien Vu
(74) *Attorney, Agent, or Firm*—Antonelli, Terry, Stout & Kraus, LLP

(57) ABSTRACT

A receptacle type intermediate connector 1 has an insulated body 2 with a forward end opening 3 for reception of a mating connector, and contacts 4 fixed in the body and each having at its end a finger 5 for engaging a foreign contact held in the mating connector. Each contact has at its other end a leg 6 adjoined to one electric wire in a signal transmission cable. A metallic shield composed of covers 7–9 encloses the body 2, the contact legs 6 and wires' bare ends, and has a collar portion 23 gripping a shielding layer of the cable. The connector has an insulated housing 10 and 11 covering the metallic shield disposed in the housing. The forward region of first metallic cover 7 of the shield is formed as a squarely-cylindrical portion 15. This portion protrudes ahead the end opening 3, so that the connector will meet requirements prescribed in the IEEE standards for high-frequency transmission apparatuses, and the end opening for the mating connector has an improved shielding property.

4 Claims, 7 Drawing Sheets

RECEPTACLE TYPE INTERMEDIATE CONNECTOR

FIELD OF THE INVENTION

The present invention relates to an intermediate connector for attachment to a high-frequency transmission cable so as to be disposed between electronics apparatuses or incorporated in the internal wiring within any single electronics apparatus, and more particularly relates to a receptacle type intermediate connector effectively shielded with anti-noise metallic covers.

PRIOR ART

The current standard 'IEEE-1394' mainly prescribes certain plug type intermediate connectors and additionally certain receptacle types of base connectors to be surface mounted on printed circuit boards. Some receptacle types of intermediate connectors are also known in the art, and they are of such a structure that their insulated body with contacts held therein has an end opening into which a mating connector will be inserted in use. However, solely the outer face of the insulated body has been enclosed with a shielding metallic cover. Due to such a simple structure, the shielding effect around the end opening has been insufficient, failing to enhance usage thereof as an intermediate connector for high-frequency current transmitting cables.

SUMMARY OF THE INVENTION

The present invention was made in view of the drawbacks inherent in the prior art structure. An object of the invention is therefore to provide a receptacle type intermediate connector that meets requirements prescribed in the IEEE standards for high-frequency transmission apparatuses, and more particularly the object is to provide an intermediate connector whose end opening for reception of a mating (plug type) connector will be shielded more effectively.

In order to achieve the objects set forth above, the present invention provides a receptacle type intermediate connector comprising an insulated body having a forward end opening for receiving a mating connector, and a plurality of contacts fixed in the insulated body and each having at one of its opposite ends a contact finger to be kept in touch with a foreign contact held in the mating connector. Each contact also has at the other end thereof a connection leg adjoined to one of electric wires constituting a signal transmission cable. The intermediate connector further comprise a metallic shield that covers the insulated body, the legs of the contacts and bare end portions of the wires, with the metallic shield having a collar portion gripping a shielding layer of the cable. The connector still further comprises an insulated housing covering substantially the entirety of the metallic shield. Characteristically, the metallic shield is composed of a first metallic cover and a second metallic cover. The first cover encloses a forward region of the insulated body, with the second metallic cover enclosing the contacts' connection legs and the bare end portions of the wires. Also characteristically, the forward end of the first metallic cover is formed as a rectangularly-cylindrical and integral portion protruding ahead the forward end opening of the insulated body.

Preferably, the first metallic cover may have three covering leaves that continue from the inner rim of said rectangularly-cylindrical portion and are bent to assume as whole a U-shape so that these three leaves enclose the upper face and side faces of said insulated body.

Also preferably, the second metallic cover may be composed a pair of U-shaped members facing one another and secured to each other. One of the U-shaped members is formed at one of its opposite ends as an auxiliary covering apron. The forward end of such an apron may be folded back into the forward end opening of the insulated body so as to form a resilient tongue, with the other end of the one U-shaped member being formed as the collar portion.

The forward end of said insulated housing of the connector provided herein may extend towards but terminate short of the end opening, and this connector may have a pair of flanges that protrude sideways and outwardly from the forward end of said housing.

THE PREFERRED EMBODIMENTS

Figure 1:
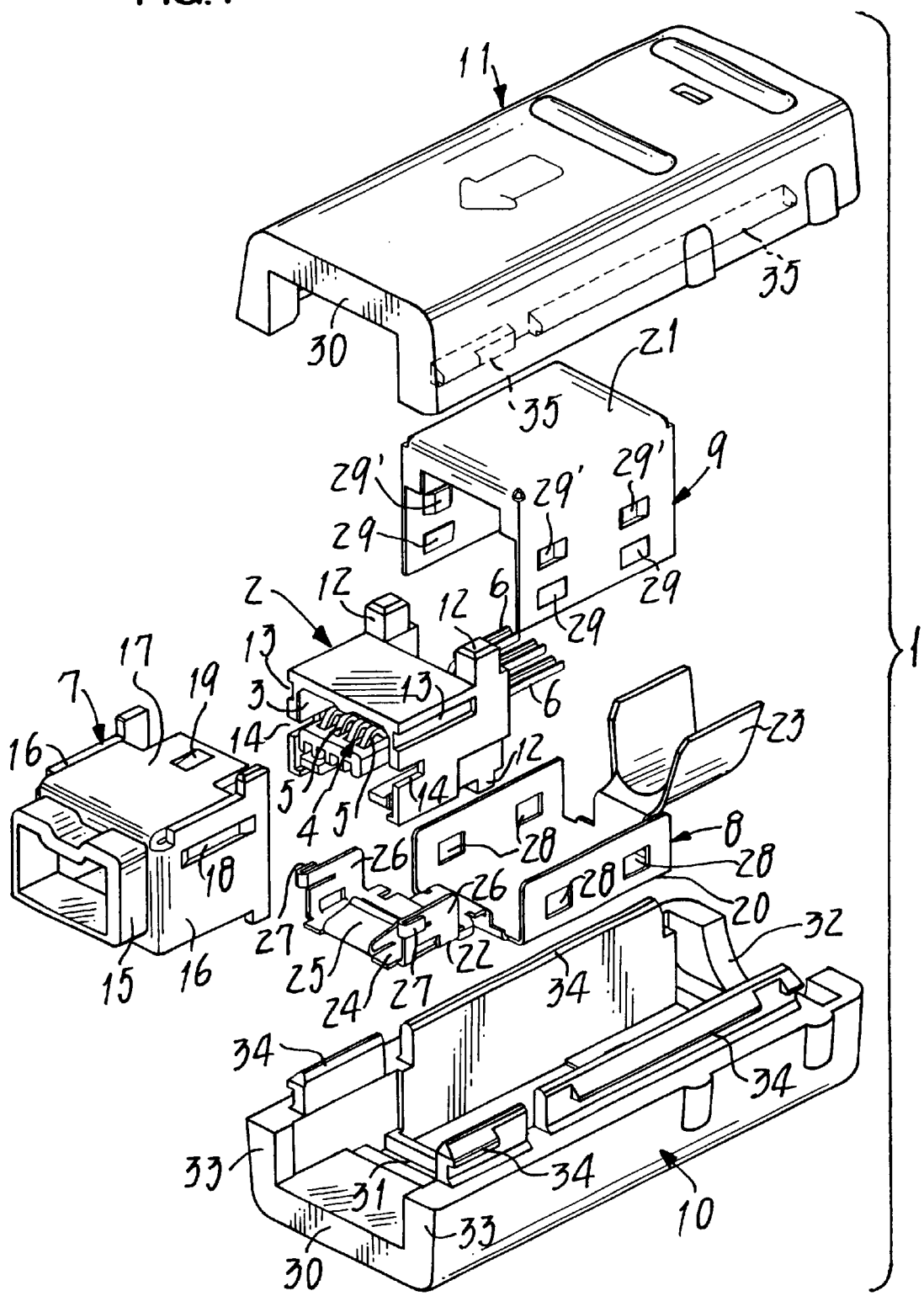
FIG. 1 is an exploded perspective view of a receptacle type intermediate connector provided in an embodiment of the present invention.

Now some embodiments of the present invention will be described in detail referring to the drawings.

FIG. 1 illustrates a receptacle type intermediate connector 1 provided herein and shown in its exploded state. This connector 1 comprises an insulated body 2 whose forward end opening is intended to receive a mating connector (not shown). A plurality of contacts 4 (see FIG. 3) held in the insulated body 2 have each at one end thereof a contact finger 5 to be kept in touch with a foreign contact of the mating connector. Each contact 4 has at its other end a connection leg 6 to be adjoined to one electric wire 41 of a signal transmission cable 40 (see FIG. 8). The connector of the invention further comprises a metallic shield composed of three pieces 7–9, and an insulated housing split up into halves 10 and 11.

The insulated body 2 is generally a short rectangular cylinder made of an insulating plastics. Guard lugs 12 are formed respectively integral with four inner corners of the insulated body 2. Formed in side walls of the insulated body are grooves 13 and cutouts 14, respectively for engagement with the corresponding portions of a first metallic cover 7 and one of second metallic covers 8 (detailed below). The contacts 4 made each by pressing a thin metal plate are fixed in the insulated body 2 and separated from each other. Their connection legs 6 protrude rearwardly from the inner end of said insulated body 2.

The shielding metallic covers 7–9 are formed also by pressing a thin metal plate, and the first one 7 and second ones 8 and 9 are prepared as discrete members. The first metallic cover 7 encloses the insulated body 2, with the second covers 8 and 9 enclosing the connection legs 6 together with the bare end portions of wires 41.

The forward end of the first metallic cover 7 is a constricted region integral therewith to provide therein a squarely cylindrical portion 15. Continuing from this cylindrical portion 15 are three covering leaves 16, 16 and 17 that are bent slightly at their regions near the rim of said cylindrical portion 15. Two of such leaves 16 are side covers disposed sideways outside the side walls of insulated body 2. The third leaf 17 overlies the top of said body 2 such that those three covering leaves assume a U-shape in cross section. A ridge 18 is pressed inwards from each side covering leaf 16 so as to be a portion integral therewith and fitting in the groove 13. A pawl 19 that is punched inwards near the rear end of top covering leaf 17 serves as a hook for detention of the inner edge of the insulated body 2.

Figure 3:
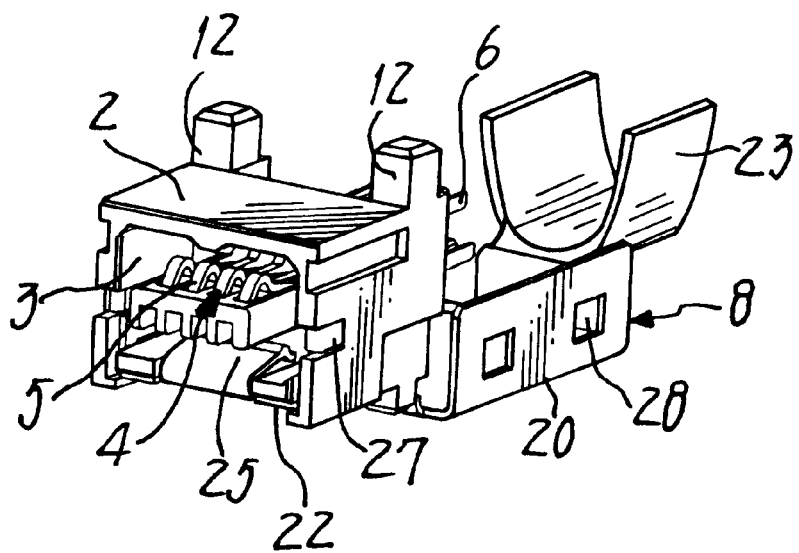
FIG. 3 is a perspective view of the principal part to which one of the two members constituting a second metallic cover has been attached.

One of the second metallic covers 8 comprises a U-shaped portion 20, and the other one 9 is a generally U-shaped member 21. Those portions or members 20 and 21 facing one another are fixed on each other. Extending forwards from the U-shaped portion 20 of the one of second covers 8 is a complementary apron 22. Continuing rearwards from the U-shaped portion 20 is a collar portion 23 for gripping the shielding layer 42 of signal transmission cable 40. The complementary apron 22 comprises a bottom covering leaf 24 formed as a forward extension of the U-shaped portion's 20 bottom. The forward protrusion of the apron 22 is bent back and upwards to provide a resilient tongue 25. Side leaves 26 of said apron 22 are bent upright and have hooking ears 27 for engagement with the cutouts 14 in the insulated body 2. As seen in FIG. 3, the resilient tongue 25 of the second metallic cover 8 combined with the insulated body 2 will extend within and rearwardly from the forward end opening 3 thereof. Thus, a shielding cover (not shown) of the mating connector will be brought into an elastic contact with the resilient tongue 25. On the other hand, side walls of the U-shaped portion 20 of the one of second covers 8 has formed therein a plurality of slots 28. Louver-like fins 29 opened up inwardly in the side walls of the U-shaped member 21 as the other second cover 9 are for engagement with those slots 28. Inward lugs 29', that are formed in the U-shaped member's 21 side walls by similarly pressing its small portions inwardly, will stop the edges of side walls forming the U-shaped portion 20 of the one of second covers 8.

The insulated housing made of an insulating plastics is split up into such halves 10 and 11 that will extend, in their assembled state, along the plane including the axes of insulated body 2 and signal cable 40. Those halves 10 and 11 of the insulated housing are each of a depressed U-shape so that their open mouths will be closed with each other when they are assembled to face one another. The bottom of each half has a groove 31 formed therein and disposed near its frontal end so as to fit on the guard lugs 12 of the insulated body 2. A semicircular recess 32 formed in the rear end of each half will serve to grip the signal cable 40.

The split halves 10 and 11 of the cover housing are identical to each other, insofar as the structure described above is concerned. However, they differ from each other as to their end faces abutting one another. In contrast with ridges 34 protruding from the end face of one of those halves 10, the other half 11 has grooves 35 formed in its end face so as to receive the ridges 34 snapped therein.

Figure 2:
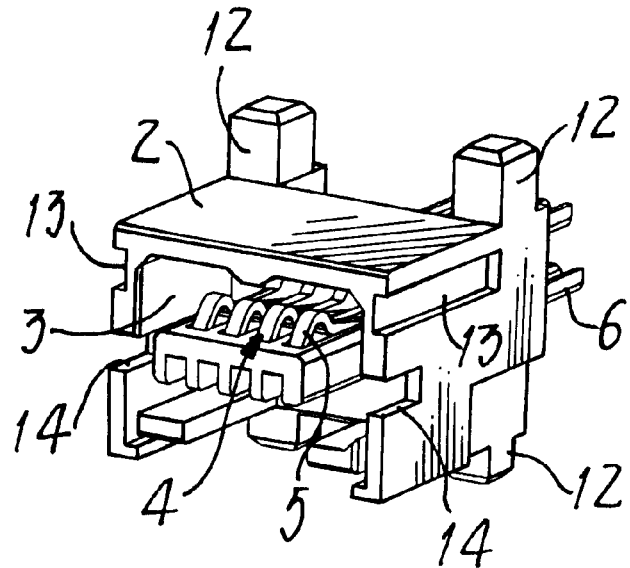
FIG. 2 is a perspective view of the principal part of the connector.
Figure 4:
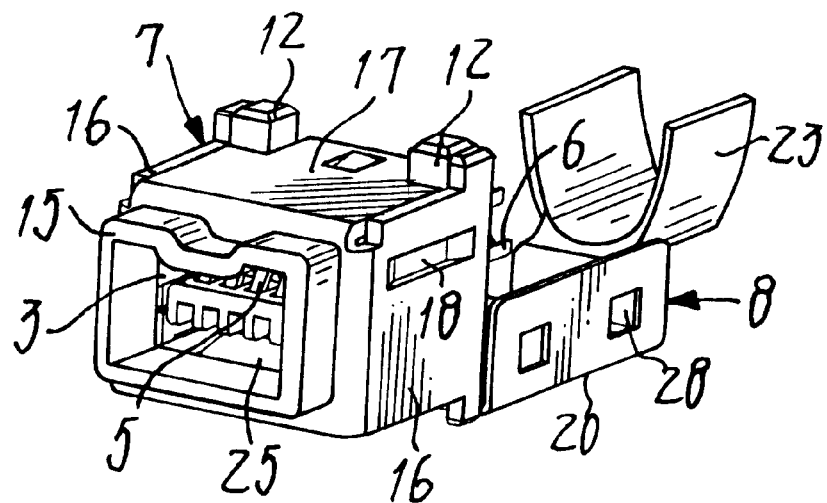
FIG. 4 is also a perspective view of the principal part to which a first metallic cover has been attached, in addition to the one member of the second metallic cover.
Figure 8:
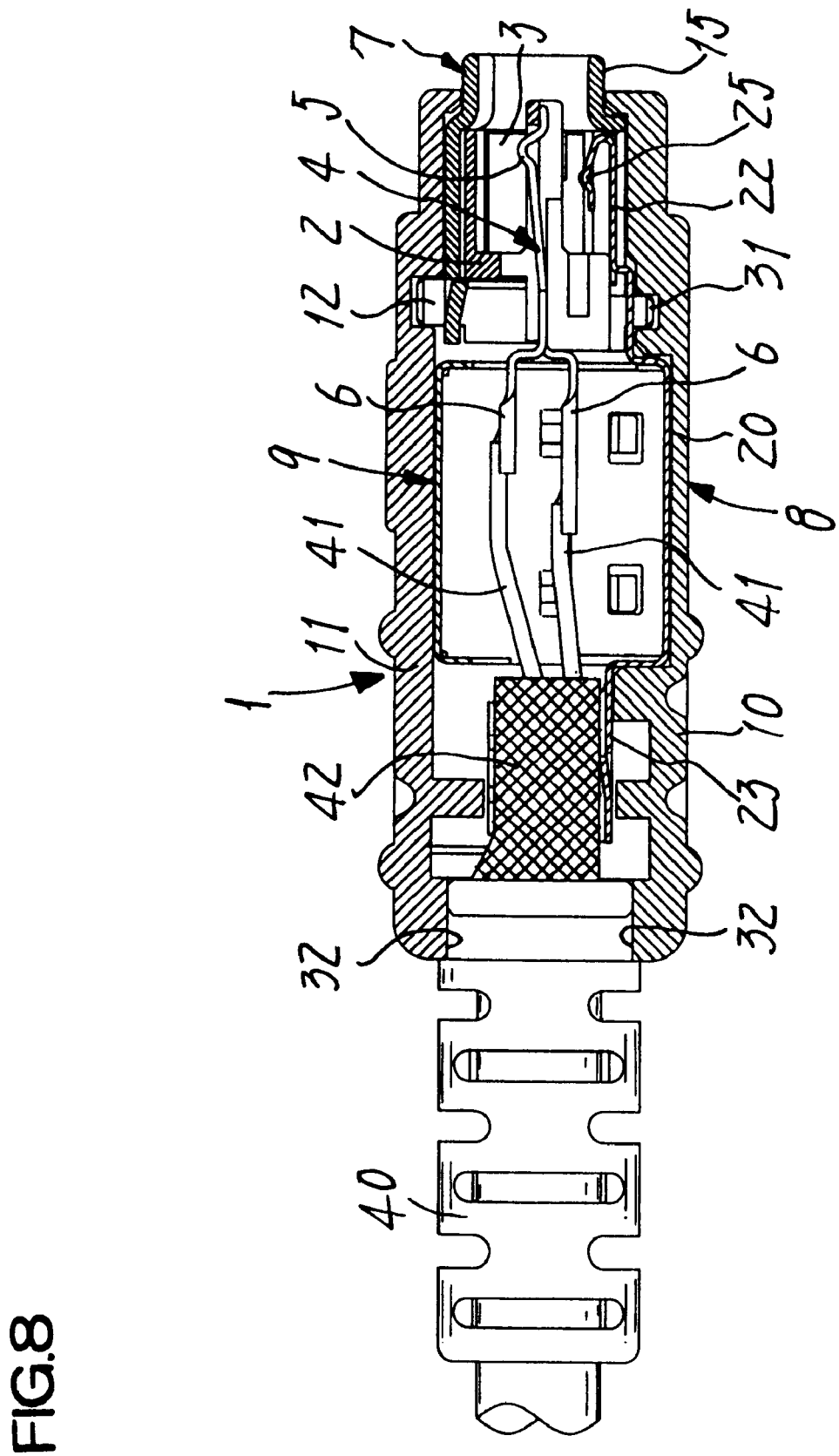
FIG. 8 is a front elevation of the intermediate connector shown partly in cross section and having a signal transmission cable attached thereto.

FIG. 8 shows the intermediate connector 1 of the invention in use, to which connector the signal transmission cable 40 is attached. At first, the rearward connection legs 6 trailing from the main insulated body 2 as shown in FIG. 2 will be crimped on or soldered to the respective wire ends 41 of said cable. Next, the hooking ears 27 of the one of the second metallic covers 8 will be engaged with the cutouts 14 in order to fix the complementary apron 22 on the insulated body 2. Thus, the open bottom of this body is closed with the apron, with its resilient tongue 25 extending inwards from the end opening 3. The shielding layer 42 of the cable 40 is then fixed in the collar portion 23. Subsequently, the first metallic cover 7 will be combined with the insulated body 2 in a manner as will be seen in FIG. 4. In detail, the ridges 18 of said cover 7 fit in the grooves 13 of said body 2, causing the pawl 19 to hook the rear edge thereof. In this state of those members, the side faces and the top face of the insulated body 2 are hidden with the side covering leaves 16 and the top covering leaf 17, respectively. The squarely-cylindrical portion 15 of the first metallic cover 7 surrounds the periphery of forward end opening 3 and juts forwards a proper distance therefrom. The bottom of said body 2 is closed with the complementary apron 22 of second metallic cover 8 as already described hereinbefore. Thus, the first cover 7 cooperates with said apron 22 to perfectly and effectively shield the outer surface of the insulated body as well as its forward region around the end opening 3.

Figure 5:
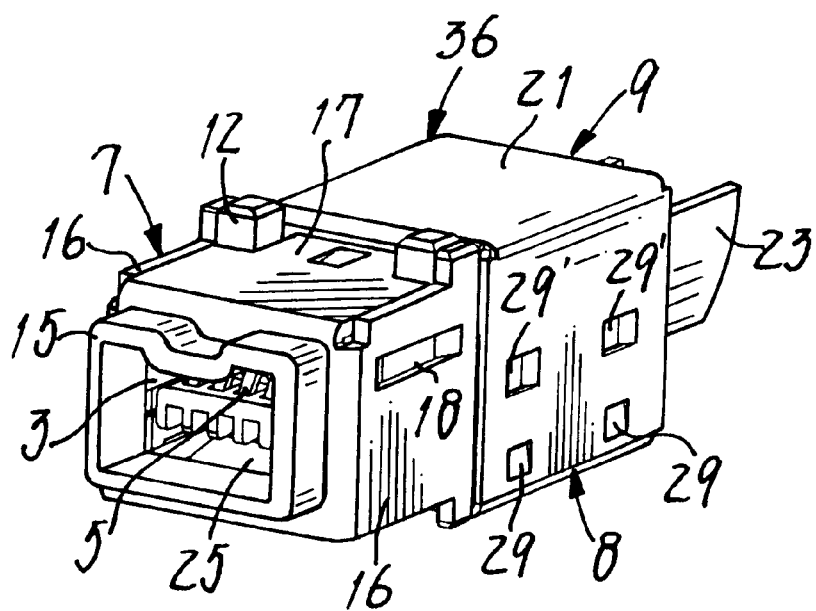
FIG. 5 similarly is a perspective view of the principal part to which the other member of the second metallic cover has been attached, in addition to the first metallic cover and the one member of said second cover.

Thereafter, the U-shaped member 21 as the second metallic cover 9 will be fitted on the U-shaped portion 20 of the other second cover 8, as shown in FIG. 5, by overlapping their side walls one another and thereby putting the louver-like fins 29 in the slots 28. A squarely cylindrical shield 36 is assembled in this way in order to afford an excellent shielding effect for the connection legs 6 and the wires' bare ends 41 attached thereto. This shield 36 is a highly rigid framework composed of the U-shaped members or portions 20 and 21 of the second metallic covers 8 and 9, so that any distortion or pulling stress imparted to the cable 40 will be born well by this shield.

Figure 6:
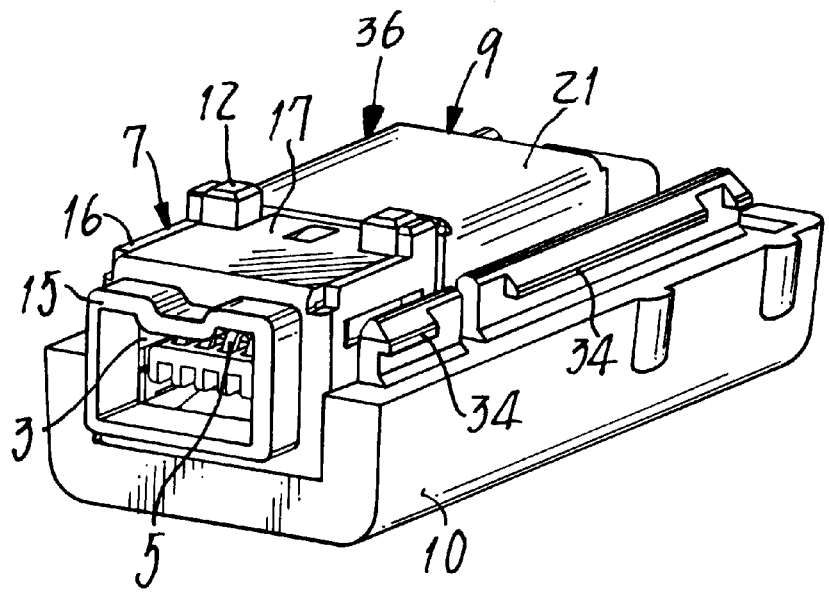
FIG. 6 is a perspective view of a subassembly shown in FIG. 5, to which one of constituent halves of an insulated housing has been attached.
Figure 7:
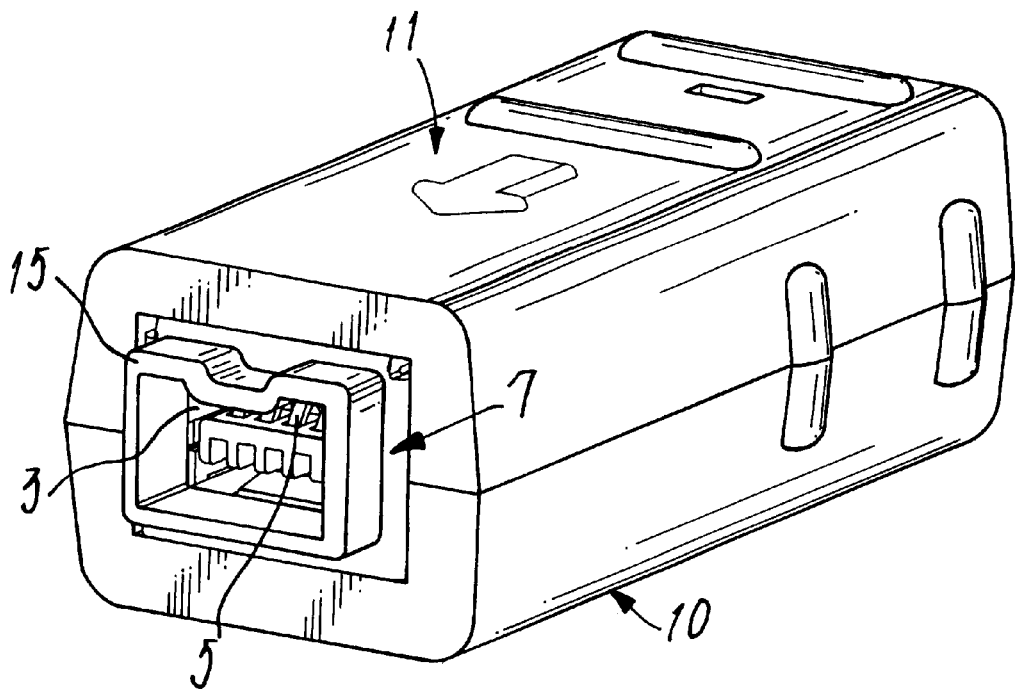
FIG. 7 is a perspective view of the subassembly shown in FIG. 5, to which both the constituent halves of the insulated housing have been attached to give a finished product, viz., the intermediate connector of the present invention.

The subassembly of the connector enclosed with the first cover 7 and the second covers 8 and 9 will then, as illustrated in FIGS. 6 and 8, be placed in the first half 10 of the insulated housing. In this state, the insulated body's 2 inner end and the guard lugs 12 are held in the groove 31 to take their correct position therein, and a proper portion of the cable 40 fits in the semicircular recess 32. Subsequent to this step, the second half 12 of the housing will be coupled with the first one as shown in FIG. 7, by snapping the ridges 34 in the respective grooves 35. The split halves 11 and 12 of the insulated housing thus sandwich firmly the subassembly to finish an intermediate connector 1. It will be seen best in FIGS. 7 and 8 that the squarely-cylindrical portion 15 of the first cover 7 protrudes ahead the housing's halves 10 and 11 in order to shield the forward end opening 3 for receiving the mating connector.

Figure 9:
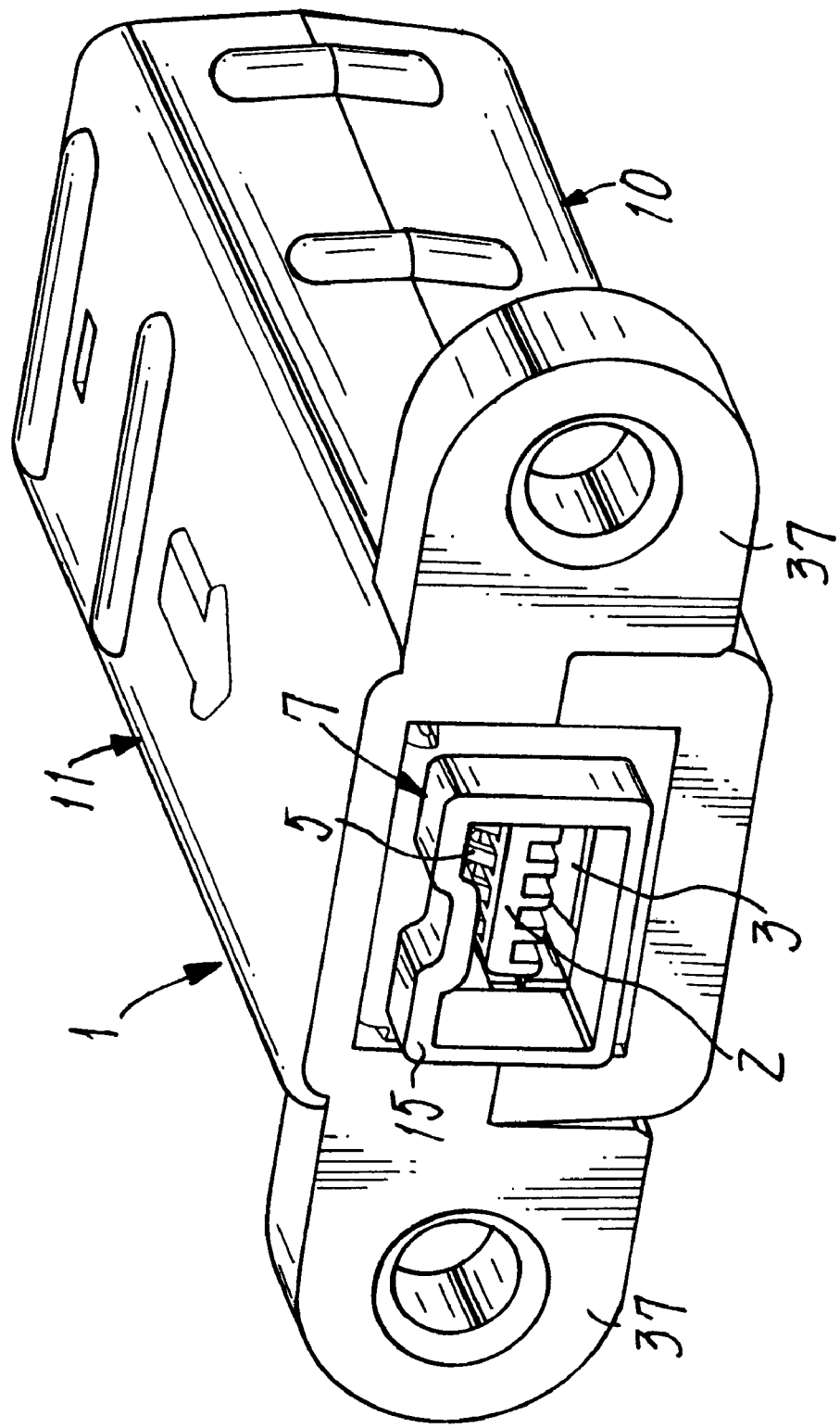
FIG. 9 is a perspective view of the receptacle type intermediate connector provided in another embodiment.

FIG. 9 shows the connector 1 provided in another embodiment, wherein the second half 11 of the insulated housing has its forward end portion formed integral with a pair of flanges 37. These flanges may conveniently serve to mount this connector 1 on a frame or chassis with use of screws.

Figure 10:
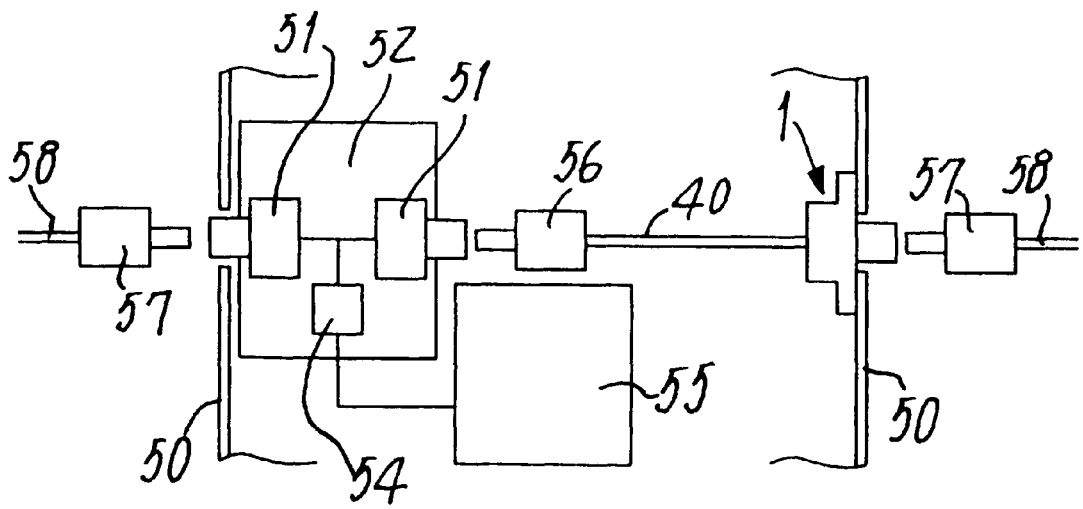
FIG. 10 is a block diagram of the internal wiring of an electronics apparatus, with the intermediate connector of the invention being employed therein.

The receptacle type intermediate connector 1 of the invention is excellent particularly in its shielding property around the end opening 3 for reception of the mating (plug type) connector. There is afforded an advantage that electronics apparatuses can precisely be connected to each other using this connector in combination with a high-frequency transmission cable. In addition, as shown in FIG. 10, this connector is also adapted for use in the internal wiring within any electronics apparatus in which the inputting and outputting of digital signals are repeated.

Figure 11:
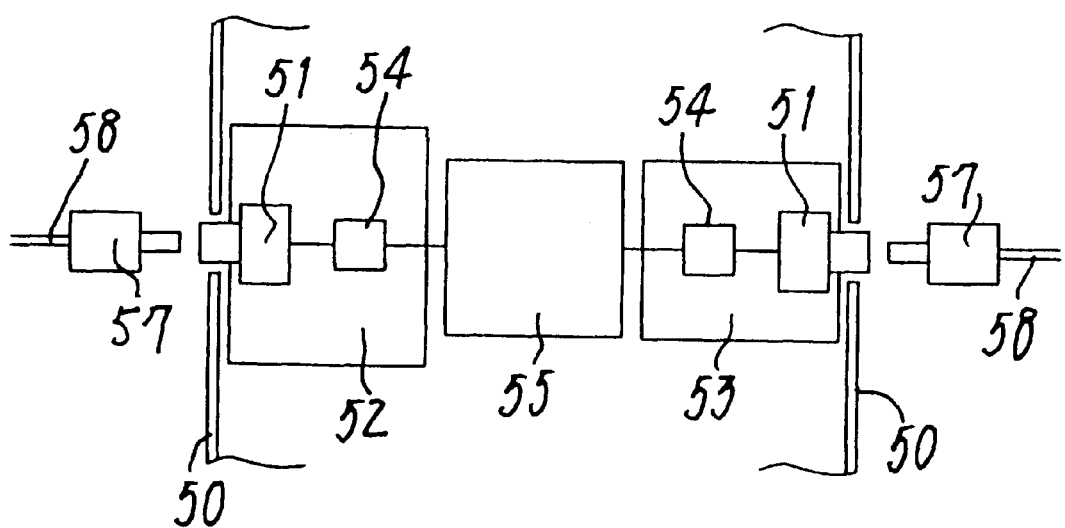
FIG. 11 is a similar block diagram of the prior art internal wiring of the electronics apparatus.

In the prior art wiring for a TV set or the like as shown in FIG. 11, receptacle type base connectors 51 as the input and or output terminals for digital signals have been mounted on a main circuit board 52 and an auxiliary circuit board 53. Those circuit boards 52 and 53 have usually been disposed inside and adjacent to the front and back faces of a chassis, respectively. A certain means for suppressing electrical noises has been employed within the chassis 50 in which input digital signals had to be output also as digital signals. In detail, an A/D converter chip 54 must convert the input digital signals into analog signals to be sent through an internal circuit 55 to the auxiliary board 53. Another A/D converter chip 54 on this circuit board 53 had to change the analog signals to digital signals before delivering them to a relevant device. In such a case, higher frequency of digital signals have needed more expensive A/D converters. The overall cost of the internal wiring might be lowered if the number of necessary A/D converters could be decreased. Extent to which the cost could be reduced would depend on frequency of the signals and the number of terminals.

The receptacle type connector 1 of the invention may be applied to such an internal wiring, together with a high-frequency transmission cable 40. In this case, the number of A/D converter chips will be reduced, while at the same time dispensing with the auxiliary circuit board 53, as seen in FIG. 10. The shielded cable 40 cooperates with the connector to suppress generation of electric noises. In detail and for example, the receptacle type intermediate connector 1 attached to one end of such a cable 40 will be mounted on a chassis 50. A plug type intermediate connector 56 that is attached to the other end of the cable 40 will be coupled with a base connector 51 mounted on circuit board 52. The reference numeral 57 in FIG. 10 denotes an external intermediate connector fixed on the one end of another shielded high-frequency cable 58.

In summary, the receptacle type intermediate connector that is of the improved features described above may advantageously be used, together with a shielded high-frequency transmission cable attached thereto, not only in the electrical connection of electronics apparatuses but also in the internal wiring of any electronic apparatus.

What is claimed is:

1. A receptacle type intermediate connector comprising:

an insulated body having a top wall and sidewalls defining a forward end opening for receiving a mating connector;

a plurality of contacts fixed in the insulated body, each contact having opposed ends, one of the opposed ends having a finger to be connected with a mating contact held in the mating connector and the other of the opposed ends being a connection leg;

a signal transmission cable comprising a plurality of electric wires, each connection leg being joined to one of the electric wires;

a metallic shield that covers the insulated body, the legs of the contacts and bare end portions of the wires;

the metallic shield having a collar portion gripping a shielding layer of the cable; and an insulated housing covering substantially the entirety of the metallic shield, wherein the metallic shield is composed of a first metallic cover enclosing a forward region of the insulated body and second metallic covers enclosing the legs of the contacts and the bare end portions of the wires, and wherein the first metallic cover comprises a forward end formed as an integral closed loop projecting flange portion having a substantially rectangular cross section protruding forwardly of the forward end opening of the insulated body, and has three covering leaves, which include a top and side leaves each continuing from the integral closed loop projecting flange portion, the three covering leaves being bent to have as whole a U-shaped cross-section so that the three covering leaves enclose an upper face and side faces of the insulated body, wherein each of said side leaves has a ridge for fitting along grooves in the sidewalls of the insulated body.

2. A receptacle type intermediate connector as defined in claim 1, wherein the second metallic covers comprise a pair of U-shaped members facing one another and secured to each other, wherein one of the U-shaped members has opposed ends and has integrally therewith and at one end a complementary apron such that a forward end of the complimentary apron is being up and backwards into the forward end opening of the insulated body so as to form a resilient tongue, and wherein the other end of the one U-shaped member is formed as the collar portion.

3. A receptacle type intermediate connector as defined in claim 1, wherein a forward end of the insulated housing extends towards but terminates before the forward end opening, and wherein a pair of flanges protrude sideways and outwardly from the forward end of said housing.

4. A receptacle type intermediate connector as defined in claim 2, wherein a forward end of the insulated housing extends towards but terminates before the forward end opening, and wherein a pair of flanges protrude sideways and outwardly from the forward end of said housing.

* * * * *